US011022668B2

(12) United States Patent
Ohishi

(10) Patent No.: US 11,022,668 B2
(45) Date of Patent: Jun. 1, 2021

(54) MAGNETIC RESONANCE IMAGING APPARATUS AND SAR EVALUATION APPARATUS

(71) Applicant: Canon Medical Systems Corporation, Otawara (JP)

(72) Inventor: Takafumi Ohishi, Yokohama (JP)

(73) Assignee: Canon Medical Systems Corporation, Otawara (JP)

(*) Notice: Subject to any disclaimer, the term of this patent is extended or adjusted under 35 U.S.C. 154(b) by 266 days.

(21) Appl. No.: 16/132,850

(22) Filed: Sep. 17, 2018

(65) Prior Publication Data

US 2019/0086499 A1 Mar. 21, 2019

(30) Foreign Application Priority Data

Sep. 19, 2017 (JP) .............................. JP2017-178905

(51) Int. Cl.
G01R 33/561 (2006.01)
G01R 33/385 (2006.01)
G01R 33/28 (2006.01)

(52) U.S. Cl.
CPC ....... *G01R 33/5612* (2013.01); *G01R 33/288* (2013.01); *G01R 33/385* (2013.01); *G01R 33/5613* (2013.01)

(58) Field of Classification Search
CPC .. G01R 33/246; G01R 33/288; G01R 33/385; G01R 33/543; G01R 33/5612; G01R 33/5613; G01R 33/5659; G01R 33/583
See application file for complete search history.

(56) References Cited

U.S. PATENT DOCUMENTS

2009/0322329 A1* 12/2009 Diehl .................. G01R 33/288 324/309
2011/0254546 A1* 10/2011 Ritter .................. G01R 33/288 324/307
2012/0013337 A1* 1/2012 Graesslin .......... G01R 33/3415 324/309
2012/0256626 A1* 10/2012 Adalsteinsson .... G01R 33/5612 324/309
2013/0063143 A1 3/2013 Adalsteinsson et al.
2013/0285660 A1* 10/2013 Ritter .................. G01R 33/543 324/314
2013/0300414 A1* 11/2013 Guerin ................ G01R 33/288 324/309

(Continued)

Primary Examiner — Steven L Yeninas
(74) Attorney, Agent, or Firm — Oblon, McClelland, Maier & Neustadt, L.L.P.

(57) ABSTRACT

A magnetic resonance imaging apparatus according to the present embodiment includes processing circuitry and imaging control circuitry. The processing circuitry selects a human body model corresponding to a subject from human body models. The processing circuitry estimates local specific absorption rates (SARs) at evaluation points determined using the selected human body model, based on the selected human body model and an amplitude and/or phase of the RF pulse in an imaging protocol for magnetic resonance imaging scheduled to be performed on the subject. The processing circuitry determines whether or not the estimated local SARs fall below a local reference value. The imaging control circuitry executes the imaging protocol by using an amplitude and phase of the RF pulse which make the local SARs fall below the local reference value.

11 Claims, 6 Drawing Sheets

(56) References Cited

U.S. PATENT DOCUMENTS

| | | | | |
|---|---|---|---|---|
| 2015/0268321 A1* | 9/2015 | Zhai | ............ | G01R 33/583 |
| | | | | 324/309 |
| 2016/0041250 A1* | 2/2016 | Kimmlingen | ........ | G01R 33/288 |
| | | | | 600/410 |
| 2016/0128574 A1* | 5/2016 | Rutt | ............ | G01R 33/5612 |
| | | | | 600/410 |
| 2016/0334477 A1* | 11/2016 | Pendse | ............ | G01R 33/31 |
| 2017/0123022 A1* | 5/2017 | Guerin | ............ | G01R 33/288 |

* cited by examiner

MAGNETIC RESONANCE IMAGING APPARATUS AND SAR EVALUATION APPARATUS

CROSS-REFERENCE TO RELATED APPLICATIONS

This application is based upon and claims the benefit of priority from the prior Japanese Patent Application No. 2017-178905, filed Sep. 19, 2017, the entire contents of which are incorporated herein by reference.

FIELD

Embodiments described herein relate to a magnetic resonance imaging apparatus and an SAR evaluation apparatus.

BACKGROUND

An input signal concerning a radio frequency (RF) pulse used for imaging in magnetic resonance imaging (hereinafter referred to as "MRI") is set to make a specific absorption rate (SAR) obtained in a subject fall below a reference value. The SAR is an index of energy of an RF pulse absorbed in body tissue of the subject, and is an index relating to safety of the subject. However, when the SAR is calculated over the whole body of the subject for each setting of the input signal concerning the RF pulse, the calculation of SARs may take time.

To shorten the time for calculating SARs, there is a method of classifying composite electric field vectors, which are composites of electric field vectors generated at points in the subject by a plurality of RF coils, into a plurality of clusters in accordance with the degrees of similarity of the composite electric field vectors, and calculating SARs at representative points of the respective clusters. It is known that the position corresponding to the locally maximum SAR (hereinafter referred to as a "maximum local SAR") depends on the human body shape; however, the above method does not take the human body shape into consideration. Therefore, the maximum local SAR estimated by the above method may be undervalued in comparison with the actual maximum local SAR.

DETAILED DESCRIPTION

A magnetic resonance imaging apparatus according to the present embodiment includes processing circuitry and imaging control circuitry. The processing circuitry selects a human body model corresponding to a subject from a plurality of human body models. The processing circuitry estimates a plurality of local specific absorption rates (SARs) at a plurality of evaluation points determined using the selected human body model, based on the selected human body model and an amplitude and/or phase of the RF pulse in an imaging protocol for magnetic resonance imaging scheduled to be performed on the subject. The processing circuitry determines whether or not the estimated local SARs fall below a local reference value. The imaging control circuitry executes the imaging protocol by using an amplitude and phase of the RF pulse which make the local SARs fall below the local reference value.

A purpose is to estimate SARs in a short time without undervaluing them.

Hereinafter, a magnetic resonance imaging apparatus (hereinafter referred to as an "MRI apparatus") according to an embodiment will be described with reference to the drawings. In the following description, structural elements having approximately the same function and configuration will be assigned with the same reference symbol, and a repetitive description will be given only where necessary.

Figure 1:
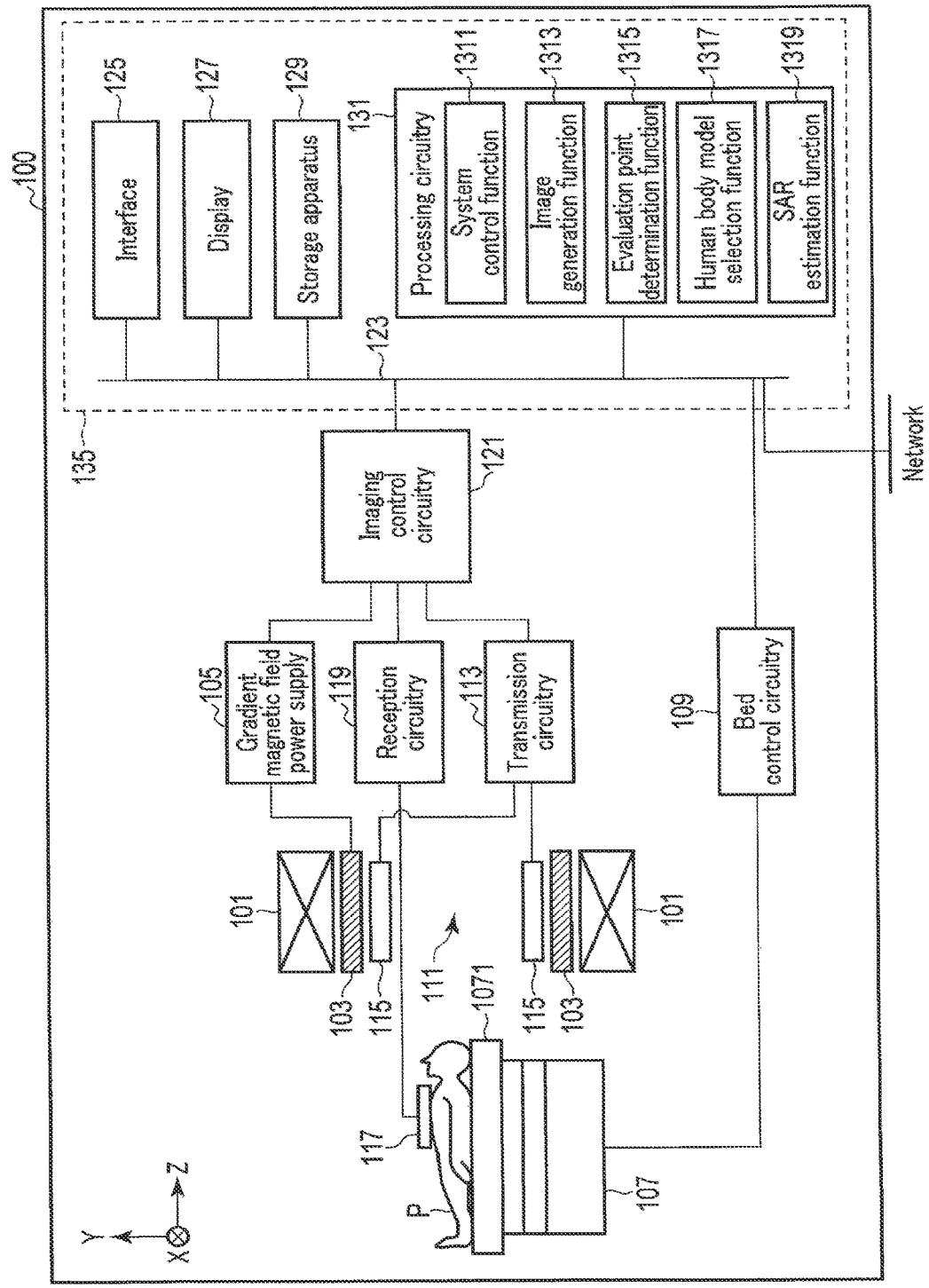
FIG. 1 is a diagram showing a configuration of the magnetic resonance imaging apparatus in the present embodiment.

The general configuration of an MRI apparatus 100 in the present embodiment will be described with reference to FIG. 1. FIG. 1 is a diagram showing a configuration of the MRI apparatus 100 in the present embodiment. As shown in FIG. 1, the MRI apparatus 100 includes a static magnetic field magnet 101, a gradient coil 103, a gradient magnetic field power supply 105, a bed 107, bed control circuitry 109, transmission circuitry (transmitter) 113, a transmitter coil 115, a receiver coil 117, reception circuitry (receiver) 119, imaging control circuitry (imaging controller) 121, a bus 123, an interface (input section) 125, a display 127, a storage apparatus (memory) 129, and processing circuity (processor) 131. The MRI apparatus 100 may include a hollow cylindrical shim coil between the static magnetic field magnet 101 and the gradient coil 103.

The static magnetic field magnet 101 is a hollow approximately-cylindrical magnet. The static magnetic field magnet 101 is not necessarily approximately-cylindrical, and may be of an open type. The static magnetic field magnet 101 generates a uniform static magnetic field in the inner space. For example, a superconducting magnet or the like is used as the static magnetic field magnet 101.

The gradient coil 103 is a hollow cylindrical coil. The gradient coil 103 is provided inside the static magnetic field magnet 101. The gradient coil 103 is a combination of three coils corresponding to X, Y, Z-axes orthogonal to one another. The Z-axis direction is the same direction as the direction of the static magnetic field. The Y-axis direction is the vertical direction, and the X-axis direction is perpendicular to the Z-axis and the Y-axis. The three coils in the gradient coil 103 are individually supplied with a current from the gradient magnetic field power supply 105, and generate gradient magnetic fields whose magnetic field intensity changes along the respective X, Y, and Z-axes.

The gradient magnetic fields of the X, Y, and Z-axes generated by the gradient coil 103 correspond respectively to, for example, a slice selection gradient magnetic field, a phase encoding gradient magnetic field, and a frequency encoding gradient magnetic field (also referred to as a readout gradient magnetic field). The slice selection gradient magnetic field is used to determine an imaging slice at will. The phase encoding gradient magnetic field is used to change the phase of a magnetic resonance (hereinafter referred to as "MR") signal in accordance with the spatial position. The frequency encoding gradient magnetic field is used to change the frequency of an MR signal in accordance with the spatial position.

The gradient magnetic field power supply 105 is a power supply device that supplies a current to the gradient coil 103 under the control of the imaging control circuitry 121.

The bed 107 is an apparatus including a top plate 1071 on which the subject P is placed. The bed 107 inserts the top plate 1071 on which the subject P is placed into a bore 111 under the control of the bed control circuitry 109. The bed 107 is installed in an examination room in which the present MRI apparatus 100 is installed so that, for example, its longitudinal direction is parallel to the central axis of the static magnetic field magnet 101.

The bed control circuitry 109 is circuitry that controls the bed 107. The bed control circuitry 109 drives the bed 107 in response to operator's instructions via the interface 125 to move the top plate 1071 in the longitudinal direction and vertical direction.

The transmission circuitry 113 supplies a radio frequency pulse (RF pulse) modulated with the Larmor frequency to the transmitter coil 115 under the control of the imaging control circuitry 121.

The transmitter coil 115 is an RF coil provided inside the gradient coil 103. The transmitter coil 115 is supplied with the RF pulse from the transmission circuitry 113 and generates a transmit RF wave corresponding to a radio frequency magnetic field. The transmitter coil 115 is, for example, a whole body coil (WB coil) including a plurality of coil elements. The WB coil may be used as a transmitter/receiver coil. The transmitter coil 115 may also be a WB coil formed by a single coil.

The receiver coil 117 is an RF coil provided inside the gradient coil 103. The receiver coil 117 receives an MR signal that the radio frequency magnetic field causes the subject P to emit. The receiver coil 117 outputs the received MR signal to the reception circuitry 119. The receiver coil 117 is a coil array including, for example, one or more, typically, a plurality of coil elements. FIG. 1 shows the transmitter coil 115 and the receiver coil 117 as separate RF coils; however, the transmitter coil 115 and the receiver coil 117 may be embodied as an integrated transmitter/receiver coil. The transmitter/receiver coil corresponds to an imaging target of the subject P, and is a local transmitter/receiver RF coil, such as a head coil.

The reception circuitry 119 generates a digital MR signal (hereinafter referred to as "MR data") based on the MR signal output from the receiver coil 117 under the control of the imaging control circuitry 121. Specifically, the reception circuitry 119 performs various types of signal processing on the MR signal output from the receiver coil 117, and then performs analog-to-digital (A/D) conversion on the data subjected to the various types of signal processing. The reception circuitry 119 performs sampling on the A/D-converted data. The reception circuitry 119 thereby generates MR data. The reception circuitry 119 outputs the generated MR data to the imaging control circuitry 121.

The imaging control circuitry 121 controls, for example, the gradient magnetic field power supply 105, the transmission circuitry 113, and the reception circuitry 119 in accordance with an imaging protocol output from the processing circuitry 131, and performs imaging on the subject P. The imaging protocol includes various pulse sequences corresponding to the examination. The imaging protocol defines the magnitude of the current supplied from the gradient magnetic field power supply 105 to the gradient coil 103, timing of the supply of the current from the gradient magnetic field power supply 105 to the gradient coil 103, the magnitude and time width of the RF pulse supplied from the transmission circuitry 113 to the transmitter coil 115, timing of the supply of the RF pulse from the transmission circuitry 113 to the transmitter coil 115, and timing of reception of the MR signal at the receiver coil 117, etc. The imaging control circuitry 121 performs, for example, a pre-scan which is performed before a main scan on the subject P to obtain a transmit RF magnetic field distribution (also referred to as a "$B_1$ map") formed by transmit RF wave(s) transmitted from a plurality of coil elements or a single coil element of the transmitter coil 115. The imaging control circuitry 121 causes the storage apparatus 129 to store the obtained $B_1$ map.

The bus 123 is a transmission path for transmitting data between the interface 125, the display 127, the storage apparatus 129, and the processing circuitry 131. The bus 123 may be connected via, for example, a network to various physiological signal measuring devices, an external storage apparatus, and various modalities.

The interface 125 includes a circuit that receives various instructions and information inputs from the operator. The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from an external input device provided separately from the present MRI apparatus 100 and outputs the received electrical signal to various circuits.

The display 127 displays, for example, various MR images generated by an image generation function 1313, and various types of information relating to imaging and image processing, under the control of a system control function 1311 in the processing circuitry 131. The display 127 also displays a specific absorption rate (SAR) estimated by an SAR estimation function 1319. The display 127 may display a warning when the SAR exceeds a reference value. The display 127 is, for example, a display device, such as a CRT display, a liquid crystal display, an organic EL display, an LED display, a plasma display, or any other display or monitor known in the relevant technical field.

The storage apparatus 129 stores, for example, MR data filled in the k space via the image generation function 1313, image data generated by the image generation function 1313, and the $B_1$ map. The storage apparatus 129 stores, for example, various imaging protocols, and an imaging condition including a plurality of imaging parameters defining each imaging protocol. The storage apparatus 129 also stores a plurality of reference values relating to the SAR. The reference value is also called a restraining value, or a limiting value. The reference values relating to the SAR are a local reference value and a whole body reference value. The local reference value is a value for determining whether or not a local SAR estimated by the SAR estimation function 1319 (hereinafter referred to as a "local SAR") exceeds a safe limit. The whole body reference value is a value for determining whether or not an average SAR over the whole body estimated by the SAR estimation function 1319 (hereinafter referred to as a "whole body average SAR") exceeds a safe limit.

The storage apparatus 129 stores programs corresponding to various functions performed by the processing circuitry 131. The storage apparatus 129 is, for example, a semiconductor memory element, such as a random access memory (RAM) or a flash memory, a hard disk drive, a solid state drive, or an optical disk. The storage apparatus 129 may also be, for example, a drive that performs writing and reading of various types of information on a CD-ROM drive, a DVD drive, or a portable memory medium such as a flash memory.

The processing circuitry 131 includes, as hardware resources, a processor and a memory such as a read-only memory (ROM) and a RAM, which are not shown, and collectively controls the present MRI apparatus 100. The processing circuitry 131 has a system control function 1311, an image generation function 1313, an evaluation point determination function 1315, a human body model selection function 1317, and an SAR estimation function 1319. Various functions performed by the system control function 1311, the image generation function 1313, the evaluation point determination function 1315, the human body model selection function 1317, and the SAR estimation function 1319 are stored in the storage apparatus 129 in the form of a program executable by a computer. The processing circuitry 131 is a processor that reads programs corresponding to the various functions from the storage apparatus 129 and executes them to realize functions corresponding to the programs. In other words, the processing circuitry 131 that has read the programs have, for example, the functions shown in the processing circuitry 131 in FIG. 1.

FIG. 1 illustrates the case where the various functions are realized in a single processing circuit 131; however, the processing circuitry 131 may be constituted by a combination of a plurality of independent processors, and the functions may be realized by the processors executing the programs. In other words, the above-described functions may be configured as programs, and executed by a single processing circuit; alternatively, a specific function may be implemented in a dedicated independent program execution circuit. The system control function 1311, image generation function 1313, evaluation point determination function 1315, human body model selection function 1317, and SAR estimation function 1319 included in the processing circuitry 131 are examples of a system controller, an image generation section, an evaluation point determination section, a human body model selection section, and an SAR estimation section, respectively.

The term "processor" used in the above description means, for example, a circuit such as a central processing unit (CPU), a graphics processing unit (GPU), an application specific integrated circuit (ASIC), or a programmable logic device (e.g., a simple programmable logic device (SPLD), a complex programmable logic device (CPLD), or a field programmable gate array (FPGA)).

The processor realizes various functions by reading and executing programs stored in the storage apparatus 129. The programs may be directly integrated in the circuit of the processor, instead of being stored in the storage apparatus 129. In this case, the processor realizes functions by reading and executing programs integrated in the circuit. Similarly, the bed control circuitry 109, the transmission circuitry 113, the reception circuitry 119, and the imaging control circuitry 121, etc. are constituted by an electronic circuit such as the above-described processor.

The processing circuitry 131 collectively controls the MRI apparatus 100 by the system control function 1311. Specifically, the processing circuitry 131 reads the system control program stored in the storage apparatus 129 and loads it in the memory, and controls each circuitry of the present MRI apparatus 100 in accordance with the expanded system control program. For example, the processing circuitry 131 reads an imaging protocol from the storage apparatus 129 by the system control function 1311 based on an imaging condition input by the operator via the interface 125. The processing circuitry 131 may generate the imaging protocol based on the imaging condition. The processing circuitry 131 transmits the imaging protocol to the imaging control circuitry 121, and controls imaging on the subject P.

The processing circuitry 131 fills MR data by the image generation function 1313 in the readout direction of the k space in accordance with the intensity of the readout gradient magnetic field. The processing circuitry 131 performs the Fourier transform on the MR data filled in the k space and generates an MR image. The processing circuitry 131 outputs the MR image to the display 127 and the storage apparatus 129.

This is the description of the general configuration of the MRI apparatus 100 according to the present embodiment. Hereinafter, the evaluation point determination function 1315, the human body model selection function 1317, and the SAR estimation function 1319, etc. in the present embodiment will be described in detail. The following description is provided assuming that the transmitter coil 115 includes a plurality of coil elements; however, the transmitter coil 115 may be a single coil.

The storage apparatus 129 stores a plurality of human body models used for estimation of the local SARs and the whole body average SAR. The human body models are distinguished by representative body shapes and builds classified according to subject information such as the sex, age, height, and weight of the subject P. The human body models are each a numerical human body model. For example, the numerical human body model simulates a human body shape and distribution of various physicality values contributing to calculation of SARs, such as density distribution and conductivity distribution, by a plurality of voxels in accordance with the anatomical structure of various tissues in a human body. The storage apparatus 129 stores each of a plurality of human body models in association with a plurality of evaluation points. The evaluation point is a position where a local SAR is estimated (calculated) by the SAR estimation function 1319 on a human body model corresponding to the subject P of a plurality of human body models. The evaluation point is determined using each human body model by the evaluation point determination function 1315. The determination of the evaluation point will be described later in the description of evaluation point determination processing.

The storage apparatus 129 stores an overevaluation coefficient u. The overevaluation coefficient u is used when the evaluation point is determined by the evaluation point determination function 1315. The overevaluation coefficient u is also used when the local SARs and the whole body average SAR are estimated by the SAR estimation function 1319. The overevaluation coefficient u is calculated by multiplying a local SAR assumed to be maximum regarding each of the human body models by a predetermined percentage. The predetermined percentage is, for example, 0.1%, 0.5%, 1%, 5%, or 10%, is set by default, and is stored in the storage apparatus 129. The predetermined percentage is appropriately changed or set by operator's instructions via the interface 125.

The overevaluation coefficient u may be calculated by, for example, the following procedure: First, a plurality of electric field distributions in a steady state generated by a plurality of coil elements of the RF coil are calculated by the processing circuitry 131 realizing the evaluation point determination function 1315. Then, the amplitude and phase of the RF pulse are set by the processing circuitry 131 to realize a sum electric field distribution obtained by bringing in phase and summing the calculated electric field distributions. Subsequently, a plurality of local SARs corresponding to a plurality of points of the whole body of each of a plurality of human body models are calculated using the set amplitude and phase and each of the human body models. Finally, an overevaluation coefficient u is calculated by multiplying the maximum local SAR of the calculated local SARs by a predetermined percentage, and is stored in the storage apparatus 129. The overevaluation coefficient u is not necessarily calculated by the above procedure, and may be stored in the storage apparatus 129 as a default value.

The storage apparatus 129 stores the total number (hereinafter referred to as a "total repetition number") k of times calculation is repeated in the evaluation point determination processing performed by the evaluation point determination function 1315. The total repetition number k may be appropriately input or set by operator's instructions via the interface 125. The storage apparatus 129 stores the initial amplitude $A_1$ and initial phase $\phi_1$ of the RF pulse used in the first calculation of the repeated calculation in the evaluation point determination processing. The initial amplitude $A_1$ and initial phase $\phi_1$ may be the amplitude and phase used for calculation of the overevaluation coefficient u, or may be the amplitude and phase which make the RF pulse maximum in the pulse sequence. The initial amplitude $A_1$ and initial phase $\phi_1$ may also be input or set in accordance with operator's instructions via the interface 125.

The storage apparatus 129 stores evaluation point $P_m$ extracted by the evaluation point determination processing, and the number (hereinafter referred to as a "repetition number") n of times the calculation is repeated in the evaluation point determination processing. The identifier m of evaluation point $P_m$ and the repetition number n are natural numbers. The storage apparatus 129 stores, for example, a program (hereinafter referred to as an "electromagnetic field analysis program") concerning electromagnetic field analysis used for estimation of SARs in the evaluation point determination function 1315 and SAR estimation function 1319.

The storage apparatus 129 stores default values of the amplitude and phase of the RF pulse for each of the imaging protocols. When parallel transmission (pTx) using each of a plurality of coil elements is performed as an imaging protocol, the amplitude and phase of the RF pulse correspond to the pTx pulse weight in the parallel transmission. The storage apparatus 129 may store the electric field distribution at the evaluation point of the electric field distribution in the steady state generated by supplying a sine wave signal corresponding to the amplitude and phase of the RF pulse to each of a plurality of coil elements, in association with the evaluation point.

The processing circuitry 131 realizing the evaluation point determination function 1315 repeats calculation of local SARs while varying the combination of the amplitude and phase of the RF pulse for each of the human body models to determine, as an evaluation point on each of the human body models, a position corresponding to the maximum local SAR of a plurality of local SARs repeatedly calculated. Hereinafter, the steps of the evaluation point determination processing will be described with reference to FIGS. 2 and 3.

(Evaluation Point Determination Processing)

Figure 2:
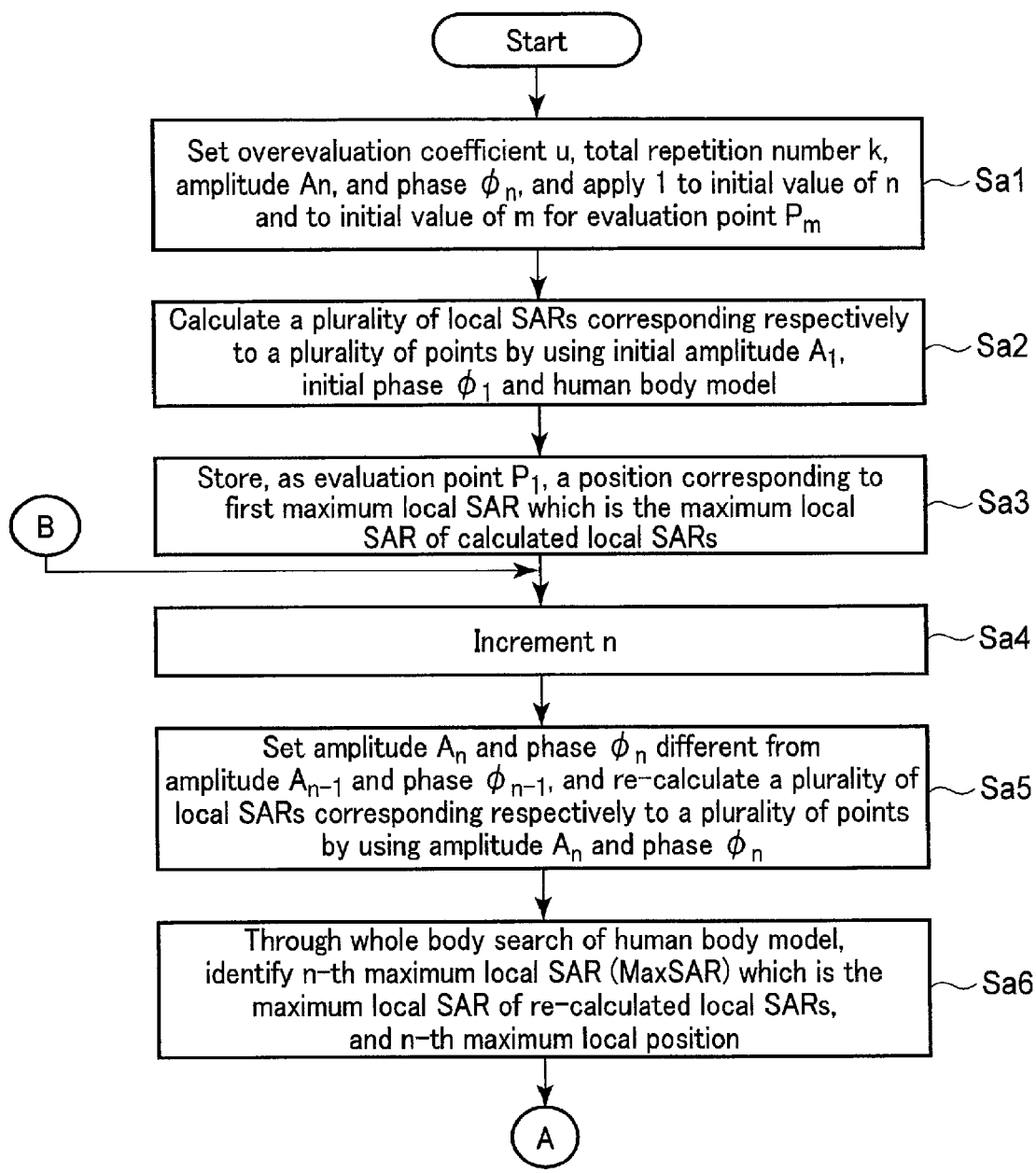
FIG. 2 is a diagram showing an example of the steps of the evaluation point determination processing in the present embodiment.
Figure 3:
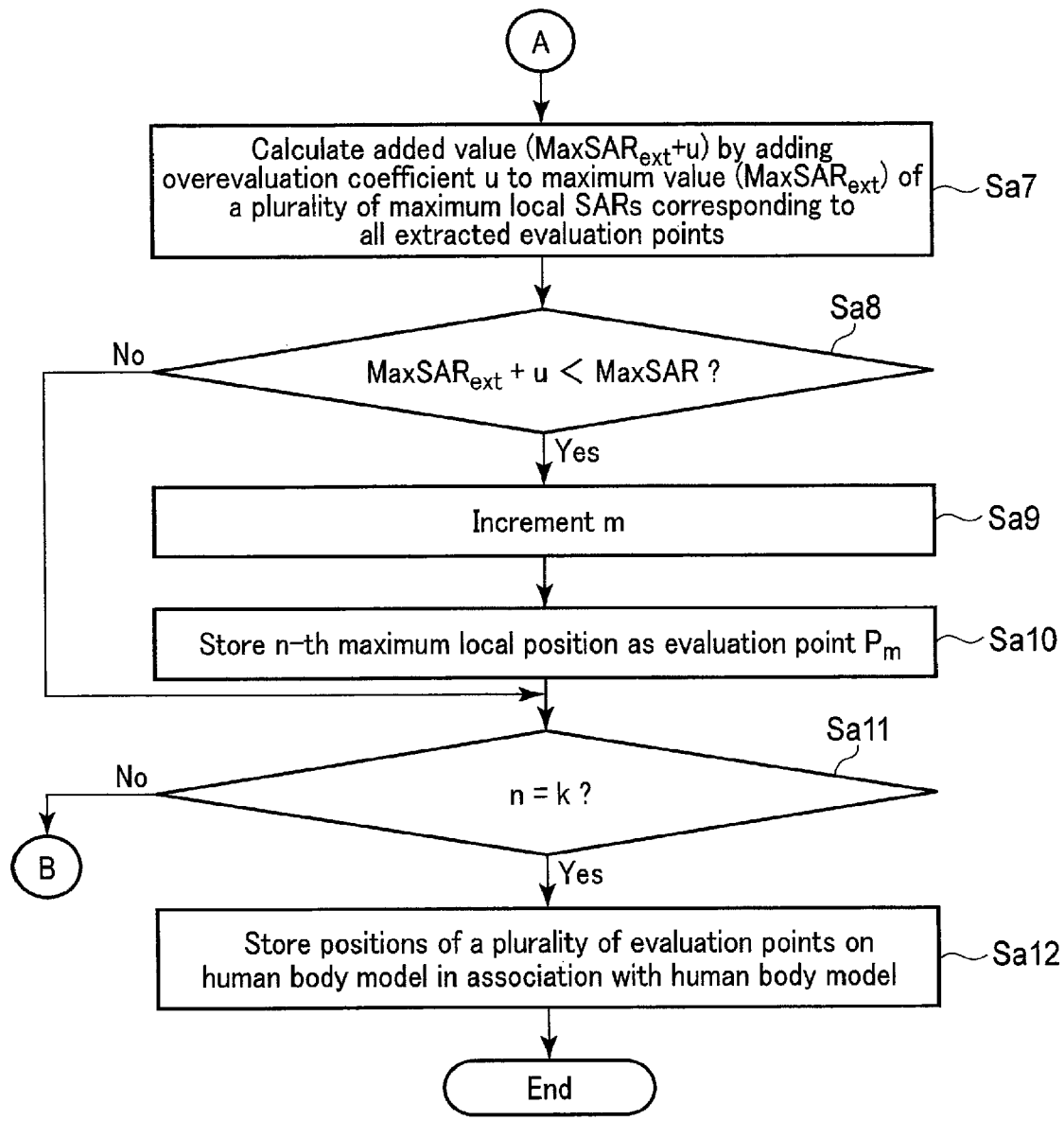
FIG. 3 is a diagram showing an example of the steps performed by the processing circuitry realizing the evaluation point determination processing in the present embodiment.

FIGS. 2 and 3 show an example of the steps of the evaluation point determination processing. The steps in FIGS. 2 and 3 are performed for each of all the human body models. The steps in FIGS. 2 and 3 are performed for each of MRI apparatuses including bores 111 in different shapes, for example, for each of the models of MRI apparatuses.

(Step Sa1)

The overevaluation coefficient u, the total repetition number k, and the amplitude $A_n$ and phase $\phi_n$ of the RF pulse are set, and 1 is applied to the initial value of n and to the initial value of m for evaluation point $P_m$. Specifically, in response to instructions to perform the evaluation determination processing, the processing circuitry 131 reads, from the storage apparatus 129, the overevaluation coefficient u, the total repetition number k, the initial amplitude $A_1$ and initial phase $\phi_1$ of the RF pulse, and the human body model used in the evaluation point determination processing. The processing circuitry 131 reads the electromagnetic field analysis program from the storage apparatus 129.

(Step Sa2)

The processing circuitry 131 calculates a plurality of local SARs corresponding respectively to a plurality of points of the read human body model by using the read initial amplitude $A_1$ and initial phase $\phi_1$, and human body model. Specifically, the processing circuitry 131 inputs the initial amplitude $A_1$ and initial phase $\phi_1$, and human body model into the electromagnetic field analysis program. At this time, the processing circuitry 131 functions as an electromagnetic field simulator. The processing circuitry 131 functioning as the electromagnetic field simulator calculates a plurality of SARs corresponding to a plurality of points of the human body model. The human body model reflects a body type and build of a human body; therefore, the calculated local SARs take values reflecting a human body shape.

The method for calculating a plurality of local SARs is not limited to the above-described method using the electromagnetic field simulator. For example, a plurality of local SARs may be calculated by the following procedure: First, the processing circuitry 131 calculates a plurality of electric field distributions in the steady state generated by a plurality of coil elements of the RF coil on the human body model by using the initial amplitude $A_1$ and initial phase $\phi_1$, and the human body model. Then, the processing circuitry 131 calculates a plurality of local SARs corresponding to a plurality of points of the human body model by using the electric field distributions and the human body model. In this method (hereinafter referred to as an electric field distribution changing method), a plurality of electric field distributions in the steady state can be changed in proportion to the change in the amplitude and phase of the RF pulse, thus SARs can be calculated faster than in the above-described method using the electromagnetic field simulator.

(Step Sa3)

The processing circuitry 131 identifies the first maximum local SAR which is the maximum local SAR of the calculated local SARs. The processing circuitry 131 identifies a position corresponding to the first maximum local SAR (hereinafter referred to as a first maximum local position).

The processing circuitry 131 stores the first maximum local position in its own memory as evaluation point $P_1$. Namely, in the first calculation of the repeated calculation in the evaluation point determination processing, the maximum local SAR is extracted from the calculated local SARs, and the position corresponding to the extracted maximum local SAR is determined as evaluation point $P_1$. The processing circuitry 131 may further determine, as evaluation points, positions corresponding to first local SARs identified from the calculated local SARs in descending order. The processing circuitry 131 stores the determined evaluation points in its own memory.

The processing circuitry 131 may calculate the overevaluation coefficient u by multiplying the first maximum local SAR by a predetermined percentage in this step. In this case, the overevaluation coefficient u is not read in step Sa1, and the calculated overevaluation coefficient u is stored in the storage apparatus 129.

(Step Sa4)

The processing circuitry 131 increments the repetition number n. Namely, the processing circuitry 131 replaces the repetition number n with n+1.

(Step Sa5)

The processing circuitry 131 sets a combination of the amplitude $A_n$ and phase $\phi_n$ different from the combination of the amplitude $A_{n-1}$ and phase $\phi_{n-1}$ of the RF pulse. Namely, in the n-th or subsequent calculation of the repeated calculation of local SARs, the processing circuitry 131 sets a combination of the amplitude $A_n$ and phase $\phi_n$ different from any of the combinations of the amplitude $A_{n-1}$ and phase $\phi_{n-1}$ used in the first to (n−1)-th calculations. For example, the processing circuitry 131 randomly sets the combination of amplitude $A_n$ and phase $\phi_n$ to be different from the combination of amplitude $A_{n-1}$ and phase $\phi_{n-1}$. Specifically, the amplitude $A_n$ is randomly set within the range between 0 and 1, and the phase $\phi_n$ is randomly set within the range between 0 and 360 degrees. The amplitude $A_n$ and phase are not necessarily randomly set, and may be set, for example, in descending order of the RF pulse in the pulse sequence. The processing circuitry 131 re-calculates a plurality of local SARs corresponding respectively to a plurality of points of the human body model by using the set amplitude $A_n$ and phase $\phi_n$, and the human body model.

The re-calculation of a plurality of local SARs is the same as step Sa2 when the electromagnetic field simulator is used, and descriptions thereof will be omitted. In the electric field distribution changing method, the processing circuitry 131 first calculates the difference value between amplitude $A_{n-1}$ and and amplitude $A_n$ and that between phase $\phi_{n-1}$ and phase $\phi_n$. Then, the processing circuitry 131 changes the electric field distributions used in the (n−1)-th calculation of the repeated calculation in accordance with the calculated difference values. Subsequently, the processing circuitry 131 re-calculates a plurality of local SARs by using the changed electric field distributions and the human body model.

(Step Sa6)

Through the whole body search of the human body model, the processing circuitry 131 identifies the n-th maximum local SAR (MaxSAR) of the re-calculated local SARs and the position of the n-th maximum local SAR (hereinafter referred to as the "n-th maximum local position"). Namely, the processing circuitry 131 extracts the n-th maximum local SAR, which is the maximum local SAR, from the re-calculated local SARs. The processing circuitry 131 may identify a plurality of n-th local SARs from the re-calculated local SARs in descending order, and identify positions of the identified n-th local SARs.

(Step Sa7)

The processing circuitry 131 identifies a plurality of local SARs corresponding to the positions stored in the second to (n−1)-th calculations of the repeated calculation from the re-calculated local SARs. Then, the processing circuitry 131 extracts the maximum value ($MaxSAR_{ext}$) from the identified local SARs. Namely, the processing circuitry 131 extracts the maximum value ($MaxSAR_{ext}$) of the maximum local SARs corresponding to a plurality of evaluation points extracted and stored in the repeated calculation. Next, the processing circuitry 131 calculates an added value ($MaxSAR_{ext}+u$) by adding the overevaluation coefficient u to the maximum value ($MaxSAR_{ext}$). For example, the processing circuitry 131 calculates the added value by adding the overevaluation coefficient u to the local SAR at evaluation point $P_m$.

(Step Sa8)

The processing circuitry 131 compares the n-th maximum local SAR with the added value. When the n-th maximum local SAR is larger than the added value ($MaxSAR_{ext}+u<MaxSAR$: Yes in step Sa8), the processing circuitry 131 performs the processing of step Sa9. When the n-th maximum local SAR is equal to or smaller than the added value ($MaxSAR_{ext}+u \geq MaxSAR$: No in step Sa8), the processing circuitry 131 performs the processing of step Sa11.

(Step Sa9)

The processing circuitry 131 increments identifier m of evaluation point $P_m$. Namely, the processing circuitry 131 replaces identifier m of evaluation point $P_m$ with m+1.

(Step Sa10)

The processing circuitry 131 stores the n-th maximum local position in its own memory as evaluation point $P_{m+1}$ together with the n-th maximum local SAR. The processing circuitry 131 may store the positions of a plurality of identified n-th local SARs as further evaluation points together with the identified n-th local SARs.

(Step Sa11)

The processing circuitry 131 compares the repetition number n with the total repetition number k. When the repetition number n is not equal to the total repetition number k ($n \neq k$: No in step Sa11), the processing circuitry 131 repeats the processing from step Sa4 to step Sa11. When the repetition number n is equal to the total repetition number k (n=k: Yes in step Sa11), the processing circuitry 131 performs the processing of step Sa12.

Figures 4, 5:
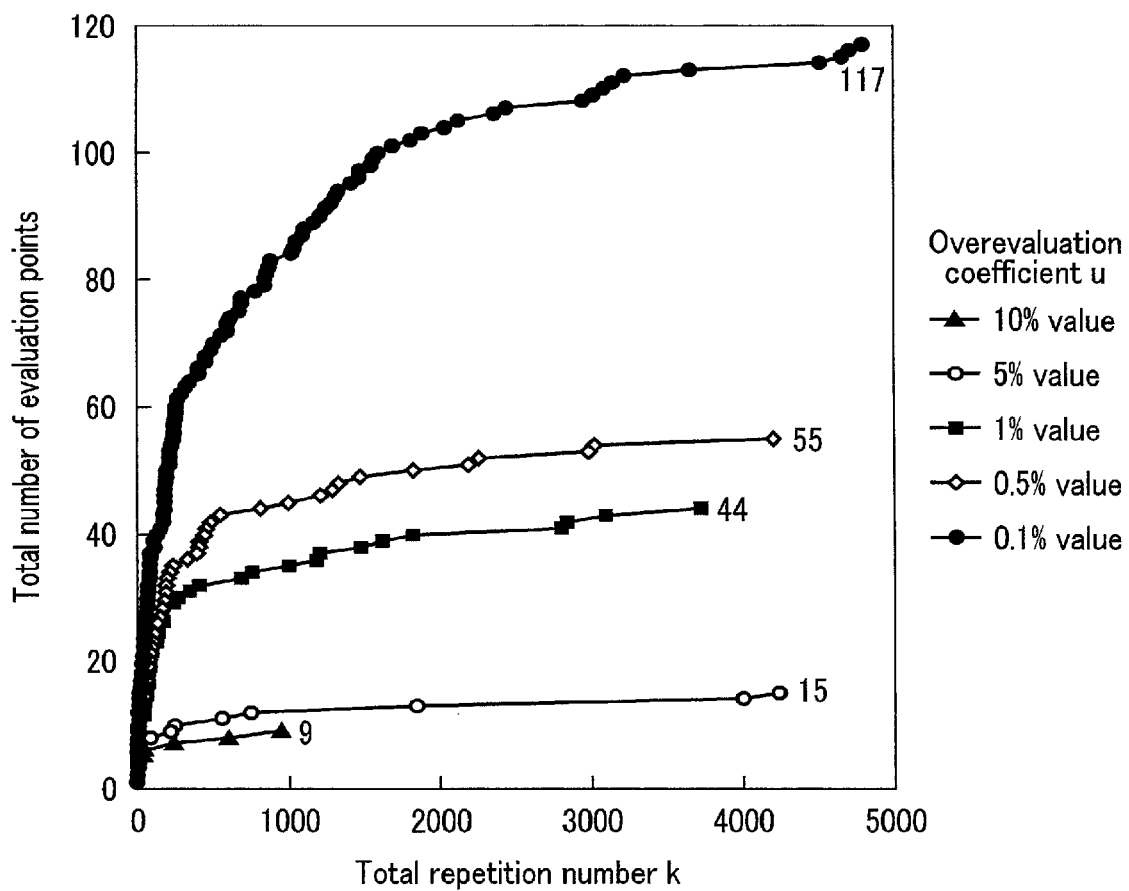
FIG. 4 is a diagram showing an example of the change in the total number of evaluation points with respect to the total repetition number in the evaluation point determination processing in the present embodiment.
FIG. 5 is a diagram showing an example of comparison between the total number of evaluation points obtained by the evaluation point determination processing in the present embodiment and the total number of evaluation points obtained by conventional processing.

FIG. 4 shows an example of the change in the total number of evaluation points with respect to the total repetition number k. As shown in FIG. 4, when the overevaluation coefficient u is larger, the total number of extracted points converges with a smaller total repetition number k. Therefore, the total repetition number k may be set by the processing circuitry 131 or by default in accordance with the magnitude of the overevaluation coefficient u.

The processing in step Sa11 relates to determination on the repeated calculation in the evaluation point determination processing; however, the repeated calculation is not necessarily stopped based on the above determination. For example, as shown in FIG. 4, the processing circuitry 131 may stop the repeated calculation based on the convergence condition of the increase in the number of evaluation points in the repeated calculation. In this case, when the total number of stored evaluation points converges in the repeated calculation, the processing circuitry 131 performs the processing of step Sa12. Specifically, the processing circuitry 131 performs the processing of step Sa12 when the total number of evaluation points does not increase even if a predetermined repetition number of calculations set as a threshold (hereinafter referred to as a number threshold) have been performed. In this case, the total repetition number k is unnecessary, and the number threshold is stored in the storage apparatus 129. The number threshold may be set by the processing circuitry 131 or by default in accordance with the magnitude of the overevaluation coefficient u.

(Step Sa12)

The processing circuitry 131 causes the storage apparatus 129 to store the positions of a plurality of evaluation points stored in its own memory in association with a human body model. The evaluation value determination processing from step Sa1 to step Sa12 may be performed to determine evaluation points when a new human body model is stored in the storage apparatus 129 via, for example, a network. By the above-described processing, the processing circuitry 131 determines a plurality of positions corresponding to a plurality of stored maximum local SARs as evaluation points on each of a plurality of human body models, and causes the storage apparatus 129 to store the determined evaluation points together with the human body model as for example, a look-up table (LUT).

FIG. 5 shows an example of comparison between the total number of evaluation points obtained by the evaluation point determination processing according to the present embodiment and the total number of evaluation points obtained by conventional processing. As shown in FIG. 5, the total number of evaluation points in the present embodiment is much smaller than the one obtained by the conventional processing. The reduction in evaluation points contributes to a reduction in the time required for estimation of local SARs used when determining the amplitude and phase of the RF pulse in an imaging protocol.

Hereinafter, the processing for determining the amplitude and phase of the RF pulse in an imaging protocol by estimating local SARs using the determined evaluation points will be described.

The processing circuitry 131 realizing the human body model selection function 1317 selects a human body model corresponding to the subject P from a plurality of human body models. For example, the processing circuitry 131 selects a human body model corresponding to the body shape of the subject P from a plurality of human body models. Specifically, the processing circuitry 131 selects a human body model used by the SAR estimation function 1319 from a plurality of human body models based on subject information on the subject P and/or a body shape image of the subject P obtained by an optical camera (not shown). The optical camera is installed, for example, in the examination room in which the present MRI apparatus 100 is installed, on a stand of the present MRI apparatus 100, or at the entrance of the examination room. The processing relating to selection of a human body model (hereinafter referred to as "human body model selection processing") will be described in detail later.

Based on the amplitude and/or phase of the RF pulse in the imaging protocol for magnetic resonance imaging scheduled to be performed on the subject P, and a human body model selected in accordance with the body shape of the subject P, the processing circuitry 131 realizing the SAR estimation function 1319 estimates local SARs at a plurality of evaluation points determined using the human body model. Specifically, the processing circuitry 131 repeatedly calculates a plurality of local SARs at a plurality of evaluation points while changing the amplitude and/or phase until the estimated local SARs fall below the local reference value. Then, the processing circuitry 131 calculates a whole body average SAR by using the human body model and the amplitude and phase which make the local SARs fall below the local reference value, and repeatedly calculates a plurality of local SARs at a plurality of evaluation points and a whole body average SAR while changing the amplitude and/or phase until the local SARs fall below the local reference value and the whole body average SAR falls below the whole body reference value. Hereinafter, processing relating to the SAR estimation function 1319 (hereinafter referred to as "SAR estimation processing") and the human body model selection processing will be described with reference to FIG. 6.

(SAR Estimation Processing and Human Body Model Selection Processing)

Figure 6:
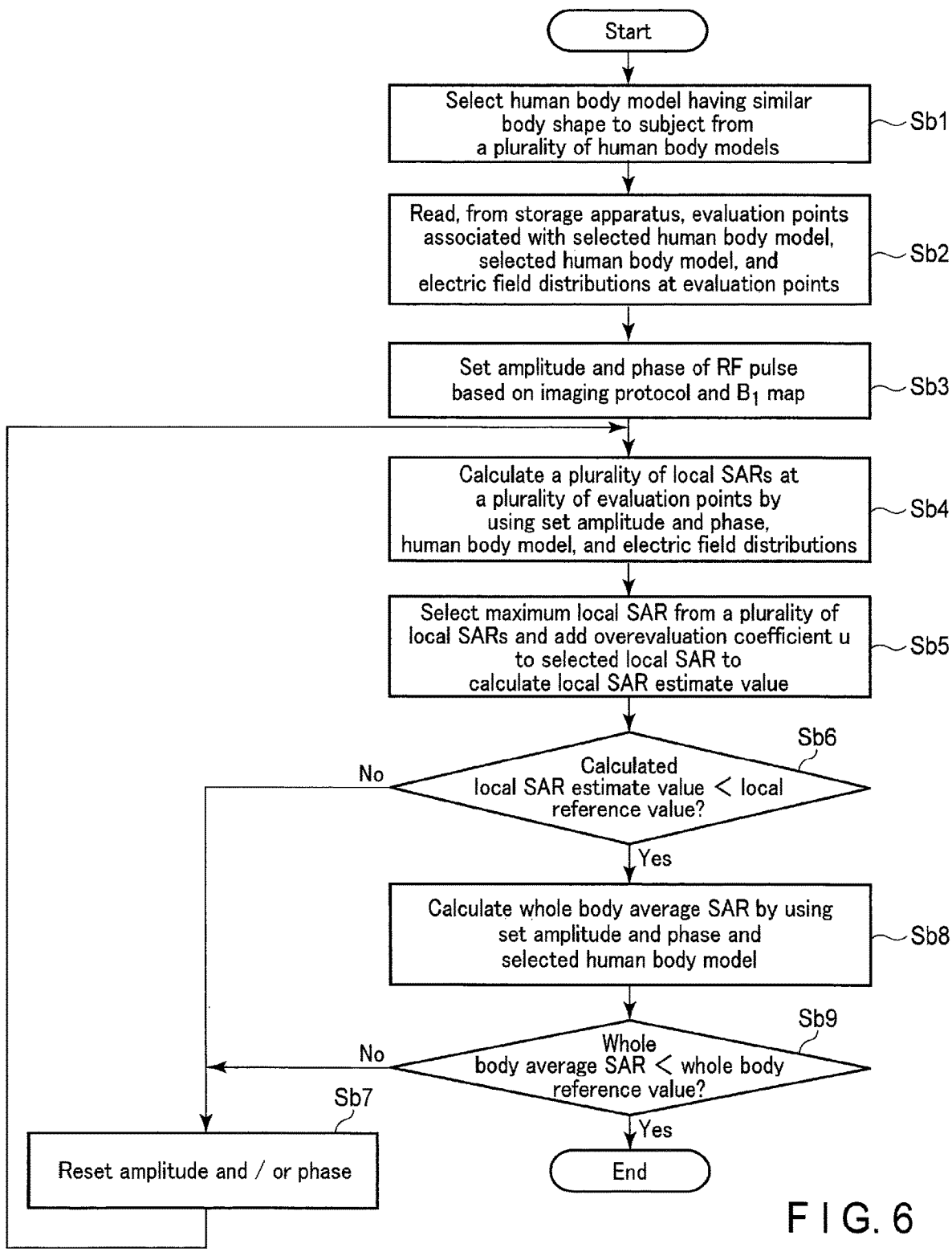
FIG. 6 is a diagram showing an example of the steps of the human body model selection processing and SAR estimation processing in the present embodiment.

FIG. 6 shows an example of the steps of the SAR estimation processing and the human body model selection processing.

(Step Sb1)

The processing circuitry 131 selects a human body model having a similar body shape to the subject P from a plurality of human body models by the human body model selection function 1317. Specifically, the processing circuitry 131 identifies a plurality of human body models having similar body shapes to the subject P in accordance with an image recognition result of the body shape in the body shape image of the subject P and subject information on the subject P. The processing circuitry 131 displays the names of the identified human body models on the display 127 in a list form. The processing circuitry 131 may display thumbnail images of the identified human body models on the display 127. When a human body model name or a human body model thumbnail image is selected by operator's instructions through the interface 125, the processing circuitry 131 sets the selected human body model as a human body model used by the SAR estimation function 1319.

(Step Sb2)

With the human body model selection function 1317, the processing circuitry 131 reads from the storage apparatus 129 a plurality of evaluation points associated with the selected human body model, the selected human body model, and the electric field distributions at the evaluation points. The processing in step Sb1 and step Sb2 corresponds to the human body model selection processing.

(Step Sb3)

Upon selection of an imaging protocol in accordance with operator's instructions via the interface 125, the processing circuitry 131 reads an amplitude and phase from the storage apparatus 129 as default values. In the case where the imaging control circuitry 121 obtains a $B_1$ map formed by transmit RF waves transmitted from a plurality of coil elements, in a step preceding the present step by, for example, a pre-scan on the subject P, the processing circuitry 131 may set the amplitude and phase used for estimation of the local SARs and the whole body average SAR by changing the amplitude and phase read by using the $B_1$ map obtained before the main scan on the subject P.

(Step Sb4)

With the SAR estimation function 1319, the processing circuitry 131 estimates a plurality of local SARs at a plurality of evaluation points by using the set or read amplitude and phase, the human body model, and the electric field distributions. The method for estimating local SARs is the same as the calculation in the processing of step Sa2, and descriptions thereof will be omitted.

(Step Sb5)

With the SAR estimation function 1319, the processing circuitry 131 selects the maximum local SAR from a plurality of local SARs. The processing circuitry 131 calculates a local SAR estimate value by adding the overevaluation coefficient u to the selected local SAR.

(Step Sb6)

With the SAR estimation function 1319, the processing circuitry 131 reads the local reference value from the storage apparatus 129. The processing circuitry 131 compares the calculated local SAR estimate value with the local reference value. When the local SAR estimate value is equal to or larger than the local reference value (No in step Sb6), the processing circuitry 131 performs the processing of step Sb7. When the local SAR estimate value is smaller than the local reference value (Yes in step Sb6), the processing circuitry 131 performs the processing of step Sb8.

(Step Sb7)

The processing circuitry 131 resets the amplitude and/or phase of the RF pulse by the SAR estimation function 1319. For example, the processing circuitry 131 decreases the amplitude set in step Sb3. The processing circuitry 131 may change the phase set in step Sb3. Alternatively, the processing circuitry 131 may decrease the amplitude set in step Sb3 and change the phase set in step Sb3. After the processing of step Sb7, the processing circuitry 131 repeats the processing from step Sb4 to step Sb6. The repeated processing in step Sb4 corresponds to the processing in step Sa5.

(Step Sb8)

The processing circuitry 131 estimates the whole body average SAR with the electromagnetic field analysis program by using the amplitude and phase set in step Sb3 and the selected human body model. The method for estimating the whole body average SAR is the same as the calculation in the processing of step Sa2, and descriptions thereof will be omitted.

(Step Sb9)

With the SAR estimation function 1319, the processing circuitry 131 reads the whole body reference value from the storage apparatus 129. The processing circuitry 131 compares the estimated whole body average SAR with the whole body reference value. When the whole body average. SAR is equal to or larger than the whole body reference value (No in step Sb9), the processing circuitry 131 performs the processing of step Sb7. When the whole body average SAR is smaller than the whole body reference value (Yes in step Sb9), the SAR estimation processing ends. In this case, the processing circuitry 131 determines the amplitude and phase set in step Sb3 or Sb7 as the amplitude and phase of the RF pulse for the imaging protocol.

After step Sb9, when instructions to start magnetic resonance imaging are input in accordance with operator's instructions via the interface 125, the imaging control circuitry 121 executes the imaging protocol using the amplitude and phase determined by the processing of step Sb9. Namely, the imaging control circuitry 121 executes the imaging protocol by using the amplitude and phase of the RF pulse which make the local SARs estimated by the SAR estimation function 1319 fall below the local reference value, and make the estimated whole body average SAR fall below the whole body reference value.

Figure 7:
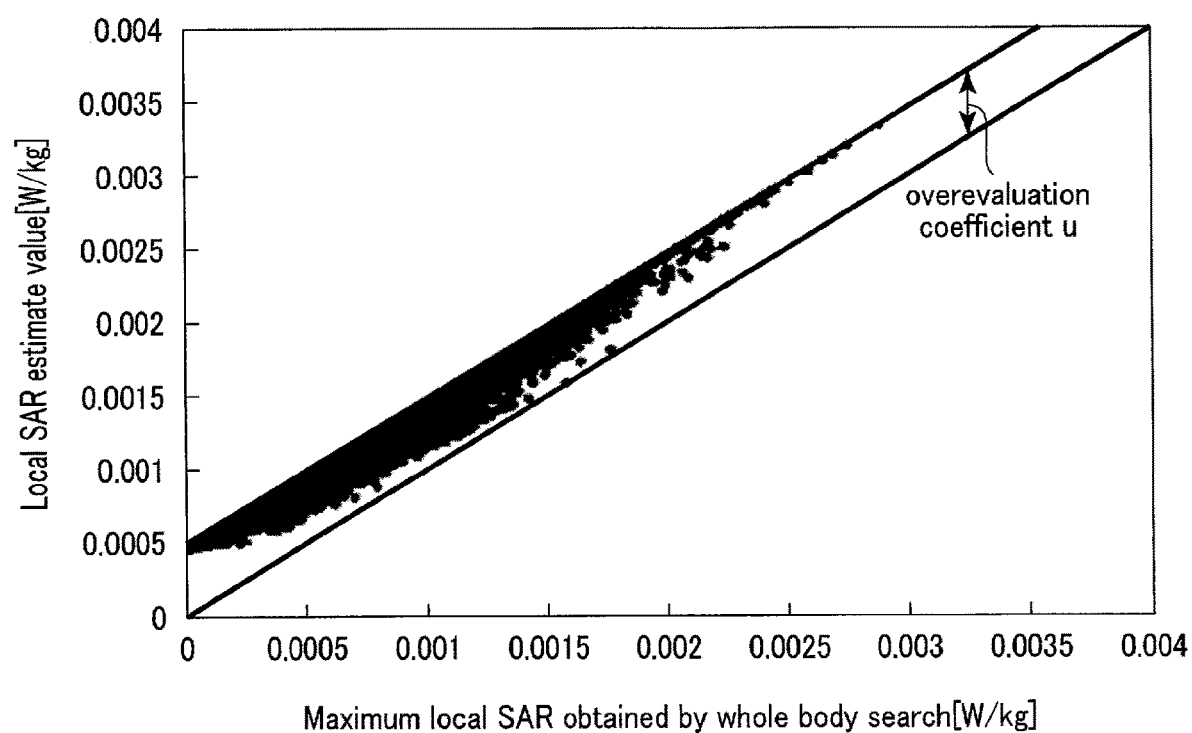
FIG. 7 is an example of the distribution of local SAR estimate values estimated by the SAR estimation processing with respect to the maximum local SARs corresponding to a plurality of evaluation points determined by the evaluation point determination processing in the present embodiment.

FIG. 7 is a diagram showing an example of the distribution of local SAR estimate values estimated by the SAR estimation processing with respect to the maximum local SARs corresponding to a plurality of evaluation points determined by the evaluation point determination processing. As shown in FIG. 7, according to the present embodiment, evaluation points are determined without undervaluing the local SAR estimate values in setting of the amplitude and phase of the transmission RF pulse in an imaging protocol, i.e., in setting of the pTx pulse weight.

The above-described configuration has the following advantages:

The MRI apparatus 100 according to the present embodiment can select a human body model corresponding to the subject P from a plurality of human body models, estimate a plurality of local SARs at a plurality of evaluation points determined using the human body model, based on the selected human body model and the amplitude and/or phase of the RF pulse in the imaging protocol for magnetic resonance imaging scheduled to be performed on the subject P, determine whether or not the estimated local SARs fall below the local reference value, and execute the imaging protocol by using the amplitude and phase of the RF pulse which make the local SARs fall below the local reference value.

Specifically, the present MRI apparatus 100 can select a human body model to be used in the SAR estimation processing from a plurality of human body models based on subject information on the subject P and/or a body shape image of the subject P obtained by using an optical camera, repeatedly calculate local SARs at evaluation points while changing the amplitude and/or phase until the estimated local SARs fall below the local reference value, calculate a whole body average SAR by using the human body model and the amplitude and phase which make the local SARs fall below the local reference value, repeatedly calculate local SARs at the evaluation points and a whole body average SAR while changing the amplitude and/or phase until the local SARs fall below the reference local SAR and the whole body average SAR falls below the whole body reference value, and execute the imaging protocol by using the amplitude and phase of the RF pulse which make the local SARs fall below the local reference value and make the whole body average SAR fall below the whole body reference value.

In addition, the present MRI apparatus 100 can repeatedly estimate local SARs at evaluation points by further using electric field distributions generated by supplying coil elements with a sine wave signal corresponding to the amplitude and phase of the RF pulse in the SAR estimation processing. Moreover, the present MRI apparatus 100 can obtain a transmit RF magnetic field distribution formed by transmit RF waves transmitted from coil elements, and set an amplitude and phase as initial values for repeatedly calculating local SARs by using the transmit RF magnetic field distribution and imaging protocol in the SAR estimation processing.

Furthermore, the present MRI apparatus 100 can store a plurality of human body models corresponding to the body shape of the subject P, and determine evaluation points of each of a plurality of human body models by repeatedly calculating local SARs while changing the combination of the amplitude and phase of the RF pulse for each of the human body models in the evaluation point determination processing. Specifically, the present MRI apparatus 100 can calculate a plurality of local SARs corresponding to a plurality of points over the whole body of each of a plurality of human body models by using the initial amplitude and initial phase of the RF pulse and each of the human body models in the first calculation of the repeated calculation of local SARs in the evaluation point determination processing, store the first maximum local position indicating the position of the first maximum local SAR which is the maximum local SAR of the calculated local SARs, re-calculate a plurality of local SARs by using a combination of the amplitude and phase different from the combinations of the amplitude and phase in the first to n-th calculations and each of the human body models and, when the (n+1)-th maximum local SAR which is the maximum local SAR of the re-calculated local SARs is larger than the added value, store the (n+1)-th maximum local SAR and the (n+1)-th maximum local position, and determine the stored positions as evaluation points for each of the human body models. Moreover, when the total number of evaluation points converges in the repeated calculation in the evaluation point determination processing, the repeated calculation can be stopped.

Furthermore, the present MRI apparatus 100 can further store, as evaluation points, the positions corresponding to a plurality of first local SARs identified from a plurality of local SARs in descending order in the first calculation of the repeated calculation in the evaluation point determination processing, and further store, as evaluation points, the positions corresponding to a plurality of (n+1)-th local SARs identified from the re-calculated local SARs in descending order when the (n+1)-th maximum local SAR is larger than the added value in the (n+1)-th and subsequent calculations of the repeated calculation.

In addition, the present MRI apparatus 100 can calculate a plurality of local SARs corresponding to a plurality of points by using each of a plurality of human body models and the initial amplitude and initial phase which realize the sum electric field distribution obtained by bringing in phase and summing a plurality of electric field distributions in the regular condition generated by a plurality of coil elements of the RF coil in the first calculation of the repeated calculation in the evaluation point determined processing. Moreover, the overevaluation coefficient used in the evaluation point determination processing can be set by using the first maximum local SAR in the first calculation of the repeated calculation in the evaluation point determination processing.

Accordingly, the MRI apparatus 100 according to the present embodiment can determine evaluation points fewer than before by using a human body model reflecting the human body shape as shown in FIG. 5, and thus can reduce the time for calculating SARs without undervaluing the local SAR estimate values as shown in FIG. 7 in setting of the amplitude and phase of the transmit RF pulse in an imaging protocol, i.e., insetting of the pTx pulse weight.

As a modification of the present embodiment, when the technical idea of the present MRI apparatus 100 is realized on an SAR evaluation apparatus 135, the SAR evaluation apparatus 135 includes, for example, the structural elements enclosed with the broken line in the configuration diagram of FIG. 1. The processes and functions in the present SAR evaluation apparatus 135 are the same as those described in the above embodiment, and descriptions thereof will be omitted. The advantages of the present SAR evaluation apparatus 135 are the same as those described in the above embodiment, and descriptions thereof will be omitted.

In addition, at least one function etc., of the evaluation point determination function 1315, the human body model selection function 1317, or the SAR estimation function 1319 in the present embodiment may also be realized by installing programs that execute the respective functions (an evaluation point determination program, a human body model selection program, and an SAR estimation program) in a computer such as a work station and loading them in the memory. In this case, the programs cause, for example, the computer to realize the evaluation point determination processing, human body model selection processing, and SAR estimation processing. The programs that can cause the computer to perform the methods may be distributed by being stored in various portable storage media such as a magnetic disk, an optical disk, and a semiconductor memory.

According to the MRI apparatus 100 and SAR evaluation apparatus 135 of the embodiment or the like as described above, SARs can be estimated in a short time without being undervalued.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising: processing circuitry that:
   selects a human body model corresponding to a subject from a plurality of human body models,
   estimates a plurality of local specific absorption rates (SARs) at a plurality of evaluation points determined using the selected human body model, based on the selected human body model and an amplitude and/or phase of an RF pulse in an imaging protocol for magnetic resonance imaging scheduled to be performed on the subject, and
   determines whether or not the estimated local SARs fall below a local reference value; and
imaging control circuitry that executes the imaging protocol by using an amplitude and phase of the RF pulse which make the local SARs fall below the local reference value;
wherein the processing circuitry
   calculates a plurality of local SARs corresponding to a plurality of points over a whole body of each of the human body models by using an initial amplitude and initial phase of the RF pulse and each of the human body models in a first calculation of the repeated calculation of local SARs,
   stores a position corresponding to a first maximum local SAR which is a maximum local SAR of the calculated local SARs,
   in an n-th (n is a natural number equal to or larger than 2) or subsequent calculation of the repeated calculation of local SARs, re-calculates a plurality of local SARs corresponding to the plurality of points by using each of the human body models and a combination of the amplitude and phase different from combinations in the first to (n-1)-th calculations of the repeated calculation,
   from the re-calculated local SARs, extracts a maximum value of a plurality of local SARs corresponding to positions stored in the second to (n-1)-th calculations in the repeated calculation,
   when an n-th maximum local SAR which is a maximum local SAR of the re-calculated local SARs is larger than an added value obtained by adding an overevaluation coefficient to the extracted maximum value, stores a position corresponding to the n-th maximum local SAR, and
   determines the stored positions on each of the human body models as the evaluation points.

2. The magnetic resonance imaging apparatus according to claim 1, further comprising a memory that stores the human body models, wherein the processing circuitry determines the evaluation points on each of the human body models by repeatedly calculating local SARs while changing a combination of the amplitude and phase of the RF pulse for each of the human body models.

3. The magnetic resonance imaging apparatus according to claim 1, wherein the processing circuitry stops the repeated calculation when a total number of the evaluation points converges in the repeated calculation.

4. The magnetic resonance imaging apparatus according to claim 1, wherein the processing circuitry in the first calculation of the repeated calculation, further stores, as the evaluation points, positions corresponding to a plurality of first local SARs identified from the calculated local SARs in descending order, and in the n-th or subsequent calculation of the repeated calculation, stores, as the evaluation points, positions corresponding to a plurality of n-th local SARs identified from the re-calculated local SARs in descending order when the n-th maximum local SAR is larger than the added value.

5. The magnetic resonance imaging apparatus according to claim 1, wherein the processing circuitry in the first calculation of the repeated calculation, calculates the plurality of local SARs corresponding to the plurality of points by using each of the human body models and the initial amplitude and initial phase which realize a sum electric field distribution obtained by bringing in phase and summing a plurality of electric field distributions in a steady state generated by a plurality of coil elements of an RF coil.

6. The magnetic resonance imaging apparatus according to claim 5, wherein the processing circuitry sets the overevaluation coefficient by using the first maximum local SAR in the first calculation of the repeated calculation.

7. The magnetic resonance imaging apparatus according to claim 5, wherein the processing circuitry repeatedly estimates the local SARs at the evaluation points by further using the electric field distributions generated by supplying a sine wave signal corresponding to the amplitude and phase of the RF pulse to the coil elements.

8. The magnetic resonance imaging apparatus according to claim 5, wherein the imaging control circuitry obtains a transmit RF magnetic field distribution formed by transmit RF waves transmitted from the coil elements, and the processing circuitry sets an amplitude and phase of the RF pulse as initial values for repeatedly estimating the local SARs, by using the transmit RF magnetic field distribution and the imaging protocol.

9. The magnetic resonance imaging apparatus according to claim 1, wherein the processing circuitry selects the human body model based on subject information on the subject and/or a body shape image of the subject obtained by using an optical camera.

10. The magnetic resonance imaging apparatus according to claim 1, wherein the processing circuitry repeatedly calculates the local SARs at the evaluation points while changing the amplitude and/or phase until the estimated local SARs fall below the local reference value, and calculates a whole body average SAR by using the human body model and an amplitude and phase which make the estimated local SARs fall below the local reference value and repeatedly calculates the local SARs at the evaluation points and the whole body average SAR while changing the amplitude and/or phase until the local SARs fall below the local reference value and the whole body average SAR falls below a whole body reference value, and the imaging control circuitry executes the imaging protocol by using an amplitude and phase of the RF pulse which make the local SARs fall below the local reference value and make the whole body average SAR fall below the whole body reference value.

11. An SAR evaluation apparatus comprising processing circuitry that:

selects a human body model corresponding to a subject from a plurality of human body models;

estimates a plurality of local specific absorption rates (SARs) at a plurality of evaluation points determined using the selected human body model, based on the selected human body model and an amplitude and/or phase of the RF pulse in an imaging protocol for magnetic resonance imaging scheduled to be performed on the subject, calculates a plurality of local SARs corresponding to a plurality of points over a whole body of each of the human body models by using an initial amplitude and initial phase of the RF pulse and each of the human body models in a first calculation of the repeated calculation of local SARs, stores a position corresponding to a first maximum local SAR which is a maximum local SAR of the calculated local SARs, in an n-th (n is a natural number equal to or larger than 2) or subsequent calculation of the repeated calculation of local SARs, re-calculates a plurality of local SARs corresponding to the plurality of points by using each of the human body models and a combination of the amplitude and phase different from combinations in the first to (n-1)-th calculations of the repeated calculation, from the re-calculated local SARs, extracts a maximum value of a plurality of local SARs corresponding to positions stored in the second to (n-1)-th calculations in the repeated calculation, when an n-th maximum local SAR which is a maximum local SAR of the re-calculated local SARs is larger than an added value obtained by adding an overevaluation coefficient to the extracted maximum value, stores a position corresponding to the n-th maximum local SAR, and determines the stored positions on each of the human body models as the evaluation points.

* * * * *